United States Patent
Krivokapic (10) Patent No.: US 7,012,298 B1
(45) Date of Patent: *Mar. 14, 2006

(54) NON-VOLATILE MEMORY DEVICE

(75) Inventor: Zoran Krivokapic, Santa Clara, CA (US)

(73) Assignee: Advanced MIcro Devices, Inc., Sunnyvale, CA (US)

( * ) Notice: Subject to any disclaimer, the term of this patent is extended or adjusted under 35 U.S.C. 154(b) by 255 days.

This patent is subject to a terminal disclaimer.

(21) Appl. No.: 10/211,317

(22) Filed: Aug. 5, 2002

Related U.S. Application Data (60) Provisional application No. 60/390,116, filed on Jun. 21, 2002.

(51) Int. Cl.
*H01L 29/788* (2006.01)
*H01L 29/80* (2006.01)

(52) U.S. Cl. ..................... 257/321; 257/315; 257/276

(58) Field of Classification Search ............... 257/321, 257/314, 315, 276; 438/593
See application file for complete search history.

(56) References Cited

U.S. PATENT DOCUMENTS

| | | | |
|---|---|---|---|
| 5,789,269 A | 8/1998 | Mehta et al. | |
| 5,952,692 A | 9/1999 | Nakazato et al. | 257/321 |
| 6,121,654 A | 9/2000 | Likharev | 257/315 |
| 6,703,298 B1 * | 3/2004 | Roizin et al. | 438/593 |
| 2002/0076877 A1 * | 6/2002 | Gupta et al. | 438/230 |

OTHER PUBLICATIONS

Zoran Krivokapic, U.S. App. No. 10/454,517, for "Semiconductor Device Having Conductive Structures Formed Near a Gate Electrode", filed Jun. 5, 2003.
Peter Van Zant, "Microchip Fabrication, A Practical Guide to Semiconductor Processing", McGraw Hill, Fourth Edition, p. 529.

* cited by examiner

*Primary Examiner*—Zandra V. Smith
*Assistant Examiner*—Kiesha Rose
(74) *Attorney, Agent, or Firm*—Harrity & Snyder, LLP

(57) ABSTRACT

A non-volatile memory device is provided by forming a tunnel oxide layer and a gate electrode on the tunnel oxide layer. Silicon structures are formed below the side surfaces of the gate electrode and act as a floating gate electrode for the non-volatile memory device.

20 Claims, 9 Drawing Sheets

| GOX [nm] | BOX [nm] | TOX [nm] | $t_P$ | Pr. cond | $t_E$ | Er. cond. | $t_{HCP}$ | HC Pr. Cond. |
|---|---|---|---|---|---|---|---|---|
| 15 | 1.62 | 1.8 | 11μs | $V_{gs}$=12V | 14 μs | $V_{gs}$=−10V | N/P | $V_{gs}$=10V, $V_{ds}$=4V |
| 15 | 2.05 | 2.3 | 12ms | $V_{gs}$=12V | 6ms | $V_{gs}$=−10V | 15ms | $V_{gs}$=10V, $V_{ds}$=4V |
| 15 | 2.7 | 3.3 | 0.5s | $V_{gs}$=12V | 0.4s | $V_{gs}$=−10V | 4.5ms | $V_{gs}$=10V, $V_{ds}$=4V |
| 15 | 5 | 6.1 | N/P | $V_{gs}$=12V | N/E | $V_{gs}$=−10V | 210μs | $V_{gs}$=10V, $V_{ds}$=4V |
| 10 | 1.62 | 1.8 | <100ns | $V_{gs}$=9V | 700ns | $V_{gs}$=−8V | N/P | $V_{gs}$=6V, $V_{ds}$=4V |
| 10 | 2.05 | 2.3 | 2.3μs | $V_{gs}$=9V | 4μs | $V_{gs}$=−8V | N/P | $V_{gs}$=6V, $V_{ds}$=4V |
| 10 | 2.7 | 3.3 | N/P | $V_{gs}$=9V | N/E | $V_{gs}$=−8V | 250ms | $V_{gs}$=6V, $V_{ds}$=4V |
| 10 | 5 | 6.1 | N/P | $V_{gs}$=9V | N/E | $V_{gs}$=−8V | 80ms | $V_{gs}$=6V, $V_{ds}$=4V |
| 5 | 2.7 | 3.3 | 550μs | $V_{gs}$=7V | 800μs | $V_{gs}$=−6V | >1s | $V_{gs}$=4V, $V_{ds}$=3V |
| 5 | 5 | 6.1 | 1.2μs | $V_{gs}$=7V | 1.8 μs | $V_{gs}$=−6V | >1s | $V_{gs}$=4V, $V_{ds}$=3V |

NON-VOLATILE MEMORY DEVICE

RELATED APPLICATION

This application claims priority under 35 U.S.C. § 119 based on U.S. Provisional Application No. 60/390,116, filed Jun. 21, 2002, the disclosure of which is incorporated herein by reference.

TECHNICAL FIELD

The present invention relates generally to memory devices and, more particularly, to non-volatile memory devices.

BACKGROUND ART

Non-volatile memory devices that use a small number of electrons to store data have been recently demonstrated. Such devices, however, have considerable drawbacks associated with their practical application. For example, single-electron memory devices require low operating temperatures and silicon nanocrystal-based memory devices exhibit poor data retention.

DISCLOSURE OF THE INVENTION

There exists a need for a memory device with small design features that exhibits good charge retention at normal room temperature ranges.

These and other needs are met by the present invention, where a non-volatile memory device is formed using a quantum well as a floating gate. The resulting memory device is able to achieve good charge retention at room temperature.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a memory device that includes a semiconductor substrate, a gate electrode, a dielectric layer and silicon structures. The semiconductor substrate includes a channel region, a source region and a drain region and the gate electrode has an upper surface and side surfaces. The dielectric layer is formed on an upper surface of the semiconductor substrate and extends laterally below the gate electrode. The silicon structures are formed within a portion of the dielectric layer and are located between the semiconductor substrate and each of the side surfaces of the gate electrode. The silicon structures extend laterally below a portion of the gate electrode and act as a floating gate electrode for the memory device.

According to another aspect of the invention, a method of manufacturing a semiconductor device includes forming a dielectric layer on a semiconductor substrate and forming a gate electrode on the dielectric layer, where the gate electrode has an upper surface and side surfaces. The method also includes removing a portion of the dielectric layer located beneath the gate electrode to create a cavity and oxidizing a portion of the gate electrode and the semiconductor substrate. The method further includes depositing silicon over the gate electrode and the semiconductor substrate to fill the cavity and oxidizing the silicon to form silicon oxide, where a portion of the silicon located below the side surfaces of the gate electrode is not oxidized.

According to a further aspect of the invention, a non-volatile memory device is provided. The non-volatile memory device includes a semiconductor substrate, a gate electrode, a tunnel oxide layer and a quantum well. The substrate includes a channel region, a source region and a drain region and the gate electrode has an upper surface and side surfaces. The tunnel oxide layer is formed on an upper surface of the substrate below the gate electrode. The quantum well is formed in the tunnel oxide layer and acts as a floating gate electrode for the non-volatile memory device.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The present invention addresses constraints associated with non-volatile memory devices having small design features by using a quantum well as a floating gate electrode for a memory device. The resulting memory device can be scaled well below a 5 nanometer (nm) gate length and exhibits good charge retention at room temperature.

Figure 1:
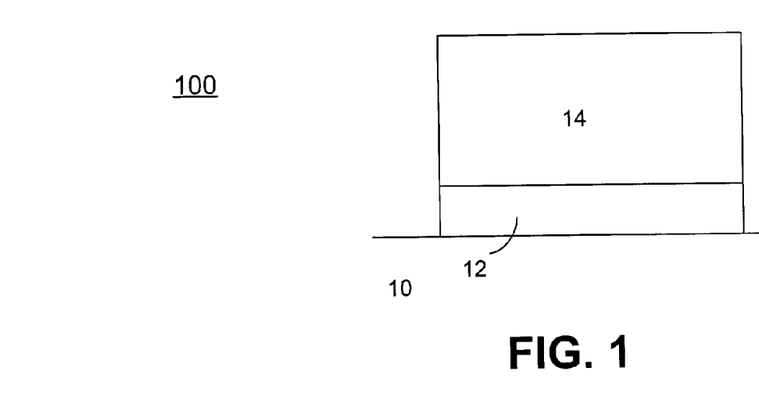
FIGS. 1–6 illustrate the cross-section of a semiconductor device formed in accordance with an embodiment of the present invention.

FIG. 1 illustrates the cross-section of a semiconductor device 100 formed in accordance with an embodiment of the present invention. Substrate 10, consistent with the present invention, comprises doped monocrystalline silicon. In an exemplary implementation, substrate 10 may be doped with p-type impurities. For example, a p-type impurity, such as boron, may be implanted at a dosage of about $5 \times 10^{12}$ atoms/cm$^2$ to about $5 \times 10^{13}$ atoms/cm$^2$ and an implantation energy of about 0–20 KeV to dope substrate 10.

A dielectric layer, such as gate oxide 12, may then be formed on semiconductor substrate 10. For example, gate oxide 12 may be grown to a thickness ranging from about 50 Å to about 150 Å. The gate oxide 12 may form a tunnel oxide layer for a memory device, as described in more detail below. After forming gate oxide 12, a conductive layer, such as n-type doped polysilicon or amorphous silicon, is deposited and patterned to form gate electrode 14. For example, n-typed doped polysilicon or amorphous silicon may be deposited to a thickness of about 1000 Å and patterned in a conventional manner to form gate electrode 14.

Figure 2:
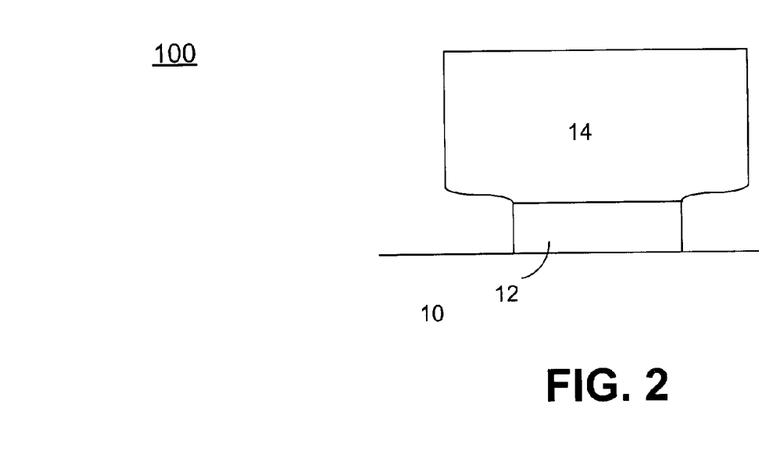

Processes consistent with the present invention may then mask the gate electrode 14 and undercut the gate oxide 12 beneath the gate electrode 14 using diluted hydrofluoric (HF) acid. FIG. 2 illustrates the results of applying diluted HF to semiconductor device 100 of FIG. 1. Referring to FIG. 2, the diluted HF may remove a portion of the gate oxide 12 beneath the gate electrode 14. In an exemplary implementation, the amount of gate oxide 12 removed by the diluted HF may extend laterally about 15 nm–50 nm from the edge of gate electrode 14. The diluted HF may also remove a small amount of the lower portion of the gate electrode 14, as illustrated in FIG. 2. In exemplary implementations in which the gate oxide 12 is relatively thin, the amount of the gate oxide 12 that is removed may be essentially self-limiting. For example, for a gate oxide 12 about 5 nm in thickness, the undercut may extend 15 nm in the lateral direction, while for a gate oxide 12 about 15 nm in thickness, the undercut may extend about 50 nm in the lateral direction.

Figure 3:
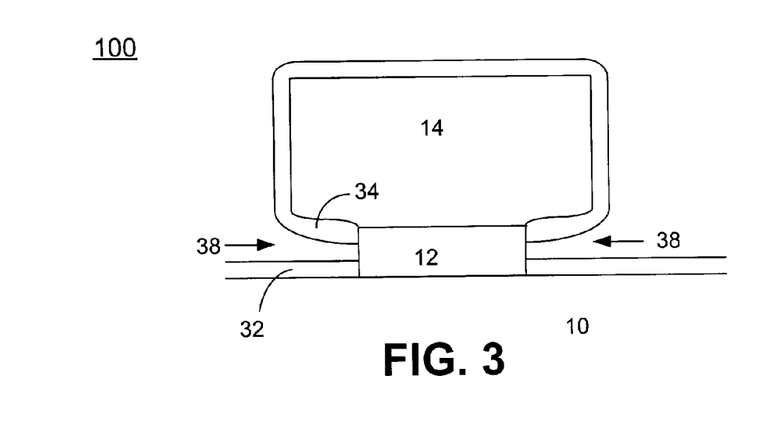

After the HF has undercut the gate oxide 12, the resulting newly exposed edges of the gate electrode 14 are then oxidized. For example, an oxide layer is thermally grown on the edges of gate electrode 14 and on the surface of substrate 10, as shown in FIG. 3. The oxide layer may be grown to a thickness ranging from about 15–50 Å. Referring to FIG. 3, the oxide layer 32 formed above the surface of substrate 10 (also referred to hereafter as the bottom oxide) is thinner than the oxide layer 34 formed on the exposed surface of polysilicon gate electrode 14 (also referred to hereafter as the top oxide), resulting in a differential oxide thickness. After the oxidation of device 100, a cavity 38 remains below the gate electrode 14.

Figure 4:
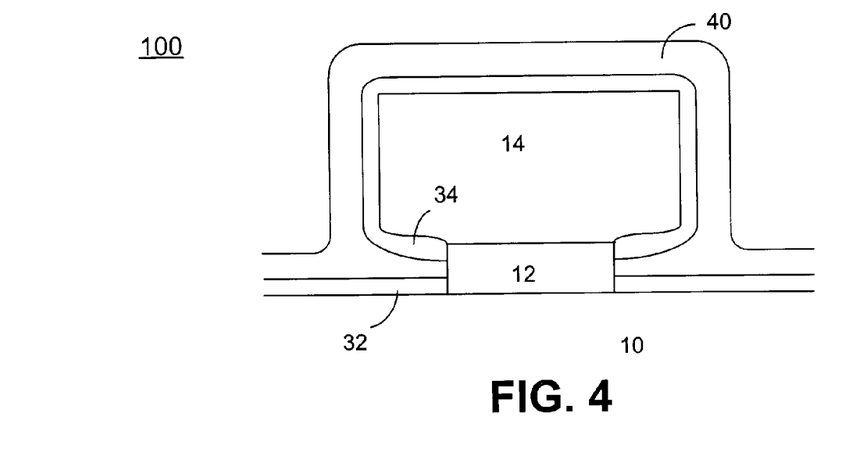

A layer of undoped polysilicon may then be deposited to fill cavity 38 beneath the gate electrode 14. Referring to FIG. 4, in an exemplary implementation, a layer of undoped polysilicon 40 may be conformally deposited via a rapid thermal chemical vapor deposition (CVD) process to a thickness ranging from about 60 Å–70 Å to fill cavity 38.

Figure 5:
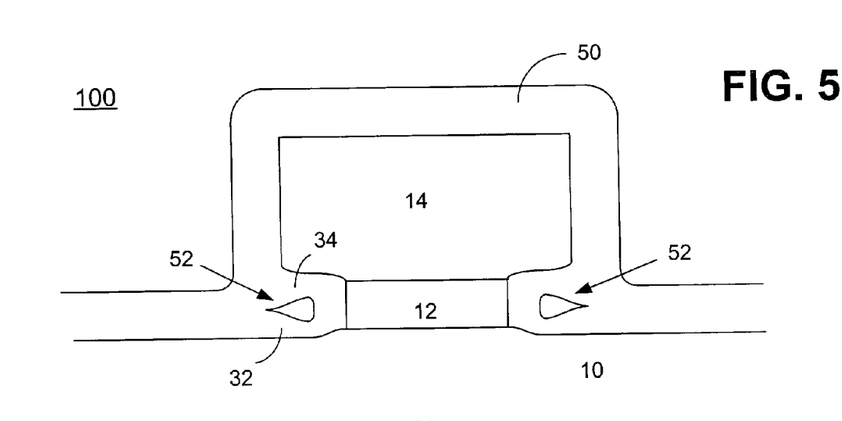

Processes consistent with the present invention may then oxidize the layer of polysilicon 40 using, for example, a dry oxidation process, to convert the polysilicon 40 into a layer of silicon oxide 50, as illustrated in FIG. 5. In the example described above in which the polysilicon 40 was deposited to a thickness ranging from about 60–70 Å, the layer of polysilicon oxide 50 after the oxidation process may be about 200 Å in thickness. The layer of polysilicon oxide 50 may be used as an oxide spacer, as described in more detail below.

After the oxidation of polysilicon layer 40, portions of the polysilicon 40 may remain in the cavity region 38 below the gate electrode 14. For example, polysilicon "inserts," (i.e., structures 52 illustrated in FIG. 5), may be formed below the lower edges of the gate electrode 14. In the exemplary implementation described above, the polysilicon inserts 52 have a teardrop-like shape and have a cross-sectional size of about 50 Å in length by 20 Å in height. It has been found that the shape of the polysilicon insert 52 creates an extremely high electric field, which accelerates Fowler-Nordheim (F-N) tunneling (i.e., results in faster programming times for the memory device described in more detail below).

It has also been found that the shape of the polysilicon inserts 52 are dependent upon the dimensions of cavity 38 (FIG. 3) and are not sensitive to the oxidation time of polysilicon layer 40. The polysilicon inserts 52 may essentially form in a continuous strip or ring that extends below the gate electrode 14. Alternatively, the polysilicon inserts 52 may form in a discontinuous manner, due to various process variations, as a number of small polysilicon pockets that are located below the gate electrode 14. In either case, the polysilicon inserts 52 may be used to act as a floating gate electrode and store charge in connection with a non-volatile memory device, as described in more detail below. In addition, if the polysilicon inserts 52 are formed in a discontinuous manner, the performance of the memory device may be improved in some implementations.

Figure 6:
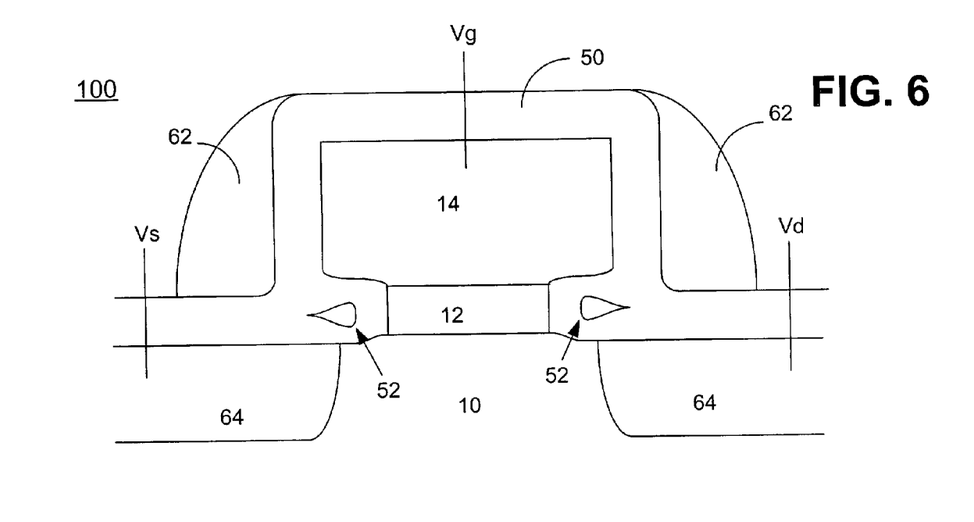

The process may continue by depositing a nitride layer and etching the nitride layer to form nitride sidewall spacers 62, as illustrated in FIG. 6. In alternative implementations, the nitride spacers 62 may not be needed and the process steps associated with forming the nitride spacers 62 may be bypassed. In either case, the process may continue by implanting an N-type dopant, such as arsenic (As), to form source/drain implants 64. The junctions for the source/drain implants may be centered below the middle of the polysilicon inserts 52, as illustrated in FIG. 6. In an exemplary implementation, As may be implanted at a dosage of about $2 \times 10^{15}$ atoms/cm$^2$ to about $4 \times 10^{15}$ atoms/cm$^2$ and an implantation energy of about 15–45 KeV to form the source/drain implants 64. An activation anneal may then be conducted to activate the source/drain regions. For example, activation annealing may be performed at a temperature of about 1025° C. to about 1050° C. for about 20 seconds to about 40 seconds to activate source drain implants 64 to form source/drain regions in semiconductor substrate 10.

The resulting semiconductor device 100 illustrated in FIG. 6 can operate as a non-volatile memory device with Vg representing the gate electrode and Vs and Vd representing the source and drain, respectively. The semiconductor device 100 may operate as a quantum-well memory device (QWMD) or a flash memory device, depending on the thickness of gate oxide 12, bottom oxide 32 and top oxide 34 and as described in more detail below.

Figure 7:
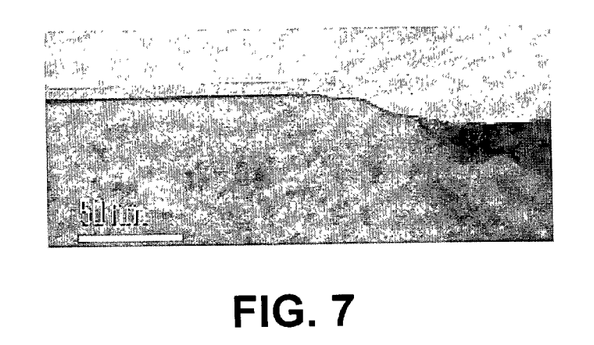
FIG. 7 is a transmission electron micrograph illustrating a semiconductor device consistent with the present invention.
Figure 8:
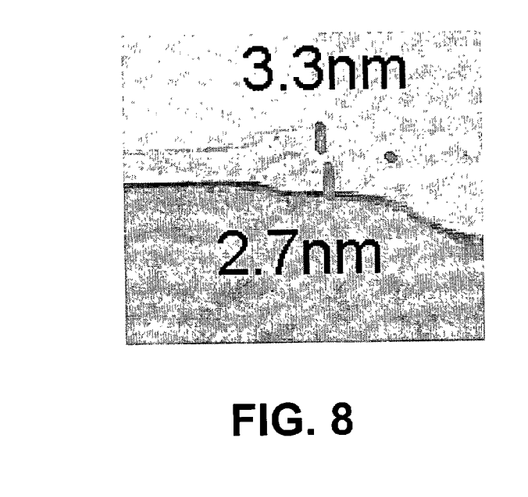
FIG. 8 is illustrates a detailed view of a polysilicon insert with differential oxides consistent with the present invention.

FIG. 7 illustrates an electron micrograph of semiconductor 100 and FIG. 8 illustrates a magnified portion of a polysilicon insert 52 with differential oxide thickness (i.e., bottom oxide thickness of 2.7 nm and top oxide thickness of 3.3 nm). Programming and erasing of device 100 may be performed by applying bias to the gate electrode 14. During programming, electrons may tunnel from the n+region 64 into polysilicon inserts 52. If the programming is F-N, programming may be accomplished by applying Vg of 6 to 7 volts and Vd of 0 volts. During the F-N programming, electrons may tunnel from the n+regions into polysilicon inserts 52 and may also tunnel through the polysilicon inserts 52 into the gate electrode 14. Erasing may be accomplished by applying Vg of −5 to −6 volts and Vd of 0 volts. During erasing, electrons tunnel from the polysilicon inserts 52 into the source/drain regions 64. Alternatively, holes may tunnel from the channel into polysilicon inserts 52 and recombine with electrons in the inserts 52. As discussed previously, it has been found that the shape of the polysilicon insert 52 creates an extremely high electric field, which accelerates F-N tunneling.

The operation speed of device 100, consistent with the present invention, has been found to be mainly determined by quantum tunneling (i.e., tunneling to and from polysilicon inserts 52). Nanoelectronic modeling (NEMO) simulations, consistent with the present invention, have been conducted to examine certain combinations of oxide thicknesses to identify various combinations that result in fast programming times.

Figure 9:
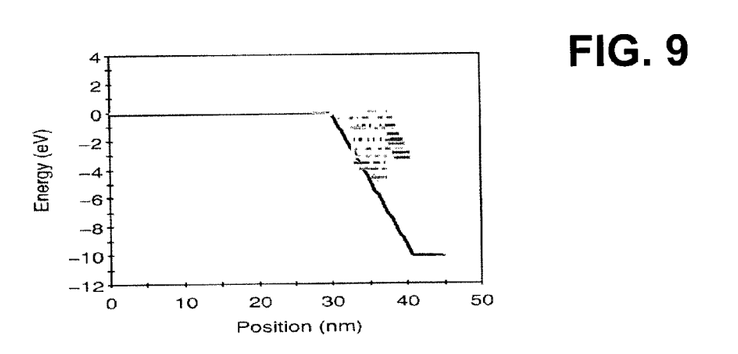
FIG. 9 is a band diagram of an exemplary semiconductor device, consistent with the present invention, during tunneling programming.
Figure 10:
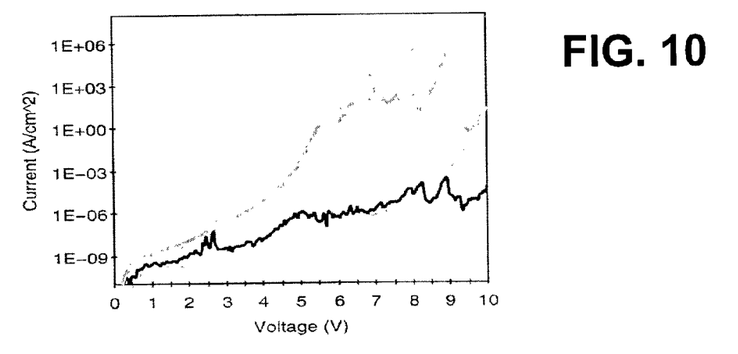
FIG. 10 illustrates nanoelectronic modeling simulations of quantum tunneling currents for an exemplary semiconductor device consistent with the present invention.

For example, FIG. 9 illustrates the band diagram of a QWMD with a 5 nm gate oxide 12, a 2.7 nm bottom oxide 32 and a 3.3 nm top oxide 34. Using NEMO simulations, the tunneling currents may be calculated. For example, FIG. 10 illustrates the quantum tunneling currents through a QWMD using NEMO 1-D simulation for the device illustrated in FIG. 9. The top curve in FIG. 10 represents the tunneling current into the polysilicon insert 52 and the bottom curve represents the tunneling current through the polysilicon insert 52 into the gate electrode 14. From FIG. 10, it can be seen that applying $V_{gs}$ of 7.5 or 9V will achieve very fast programming since there are about eight orders of magnitude difference between the two tunneling currents.

Figure 11:
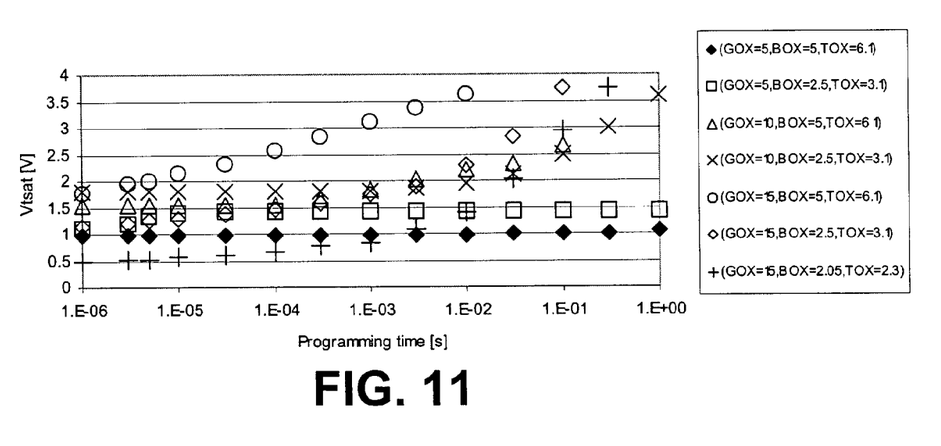
FIG. 11 illustrates hot carrier programming times for various semiconductor devices consistent with the present invention.

Semiconductor device 100 can also be programmed by using conventional hot carrier programming (e.g., drain bias of 3–4V and gate bias of 6–12V, depending on oxide thicknesses). For example, FIG. 11 illustrates programming times for a device with various gate oxide 12 (GOX), bottom oxide 32 (BOX) and top oxide 34 (TOX) thicknesses. As illustrated in FIG. 11, a device with a 15 nm GOX and 5 nm BOX may be programmed in a manner similar to a conventional flash memory. On the other hand, devices consistent with the present invention with very thin BOX and TOX may not be programmed in that manner since gate voltages may be too low for significant differential tunneling currents, while F-N electrons tunnel into the gate electrode 14.

Figure 12:
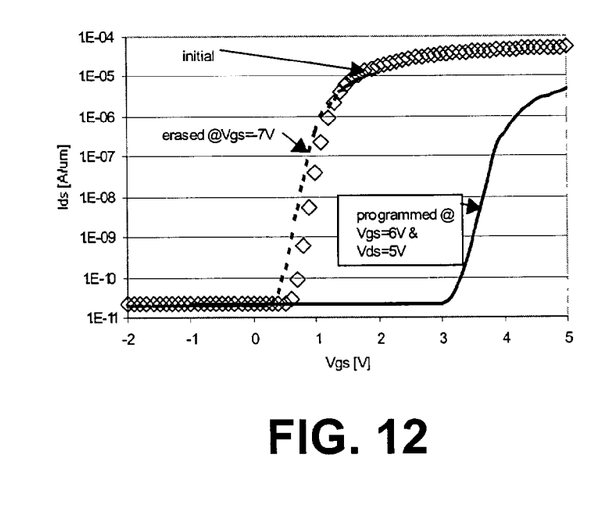
FIG. 12 illustrates slope degradation during hot carrier programming for an exemplary semiconductor device consistent with the present invention.

Hot carrier programming may not be desirable in some cases because it may trap charge in the oxide layer, such as a device with a 15 nm GOX and 5 nm BOX and as illustrated in FIG. 12. Even after erasing, the subthreshold slope may still degraded, although to a lesser extent because those states get relaxed faster, as illustrated in FIG. 12.

Figure 13:
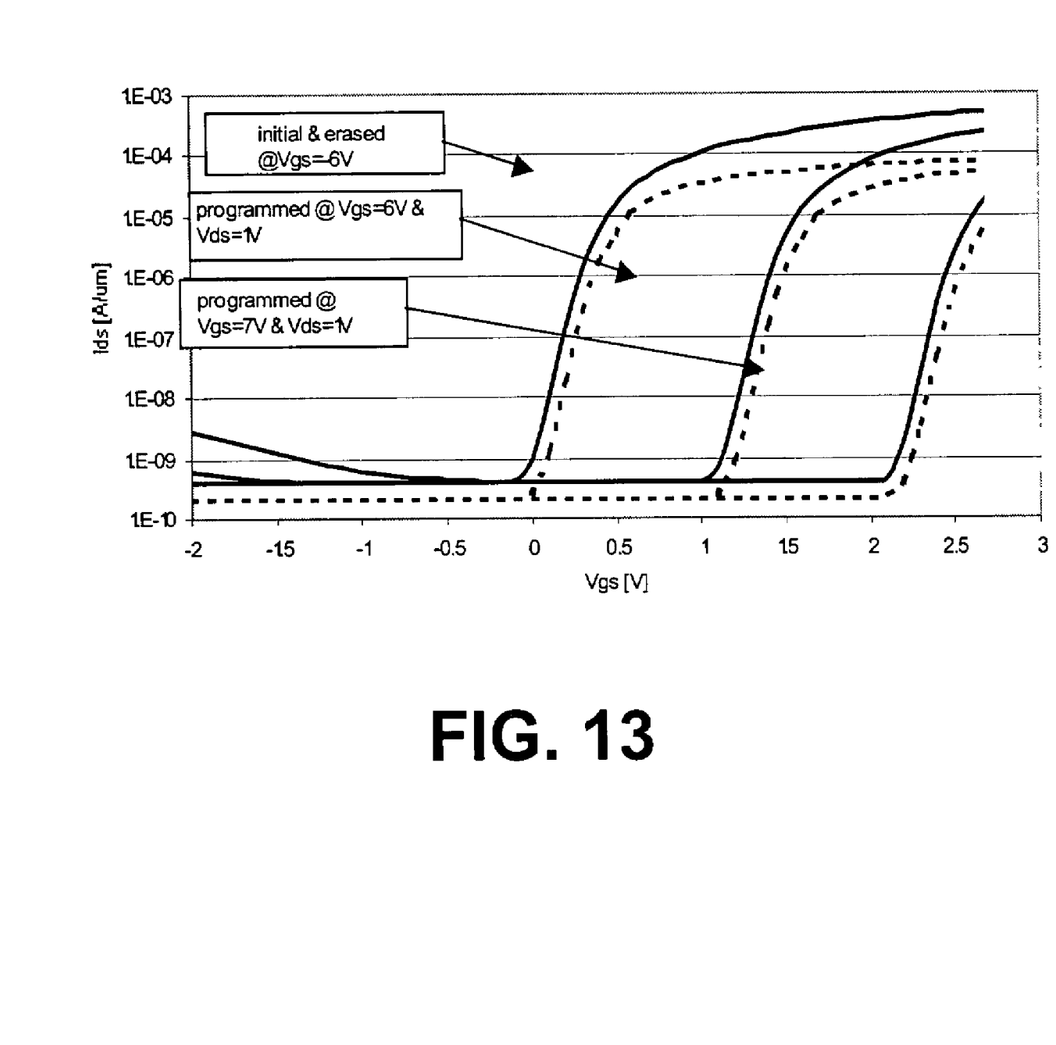
FIG. 13 illustrates tunneling programming for an exemplary semiconductor device consistent with the present invention.

FIG. 13 illustrates tunneling current programming for a QWMD device with a 5 nm GOX and 5 nm BOX, which has extremely thin polysilicon inserts 52. As illustrated in FIG. 13, the subthreshold slope (about 86 mV/dec) does not change after programming ($V_{gs}$=6 and 7V, $V_{ds}$=1V) and erasing ($V_{gs}$=−6V).

Figure 14:
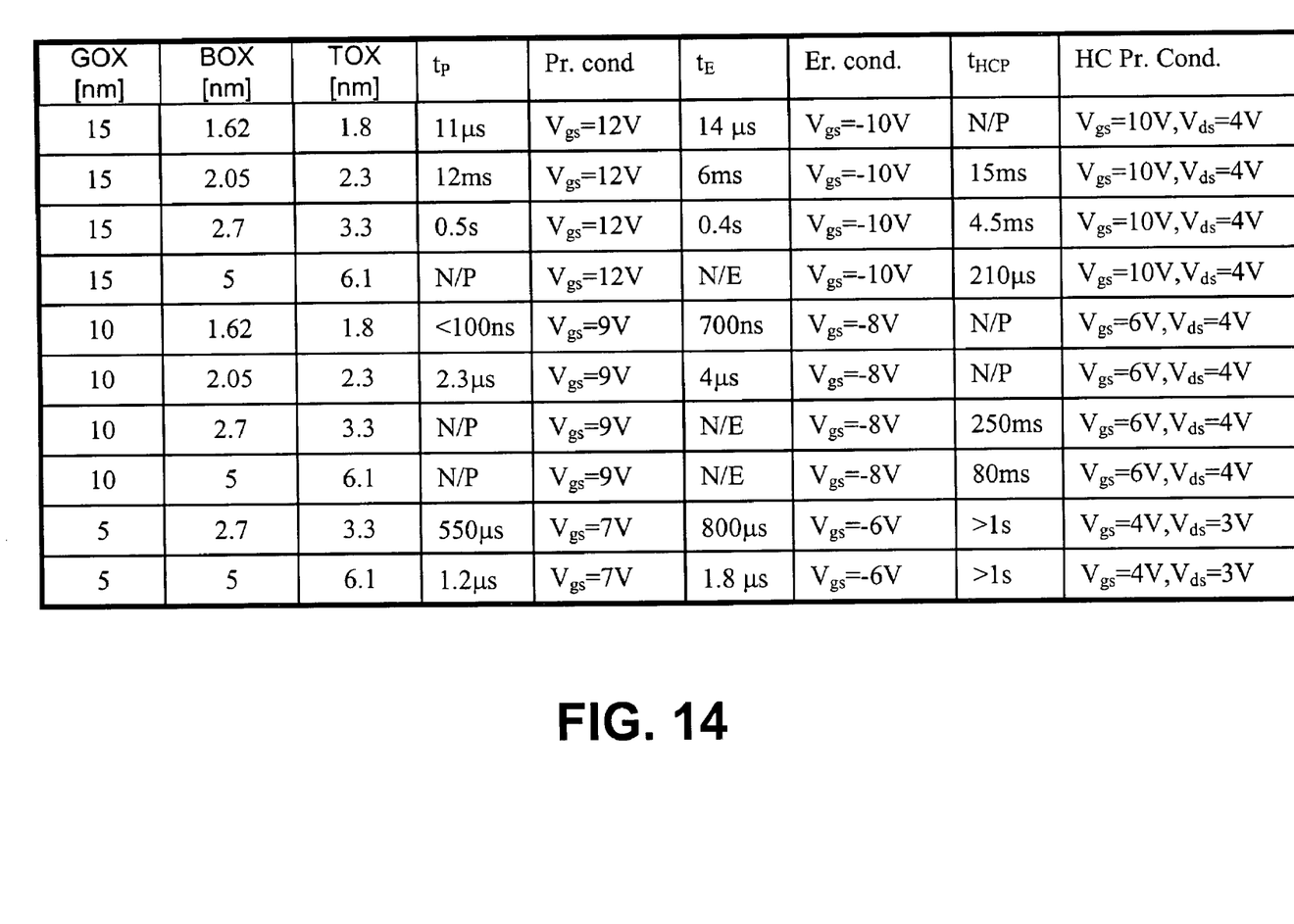
FIG. 14 illustrates programming and erasing times under a number of conditions for semiconductor devices consistent with the present invention.

FIG. 14 illustrates programming and erasing times ($t_P$ and $t_E$) for various QWMD devices under various programming and erase conditions, assuming a threshold voltage shift of one volt. FIG. 14 also illustrates hot carrier programming (HCP) times $t_{HCP}$ under various hot carrier programming conditions. From FIG. 14, it can be seen that tunneling programming speed depends on the thickness of polysilicon insert 52. For the thinnest BOX and TOX illustrated in FIG. 14, (1.62 and 1.8 nm respectively), programming time is 11 $\mu$s for a thicker GOX (15 nm), which has a thicker polysilicon insert 52, while programming time is faster than 100 ns in the case of thinner GOX (10 nm), which has a thinner polysilicon insert 52.

Figure 15:
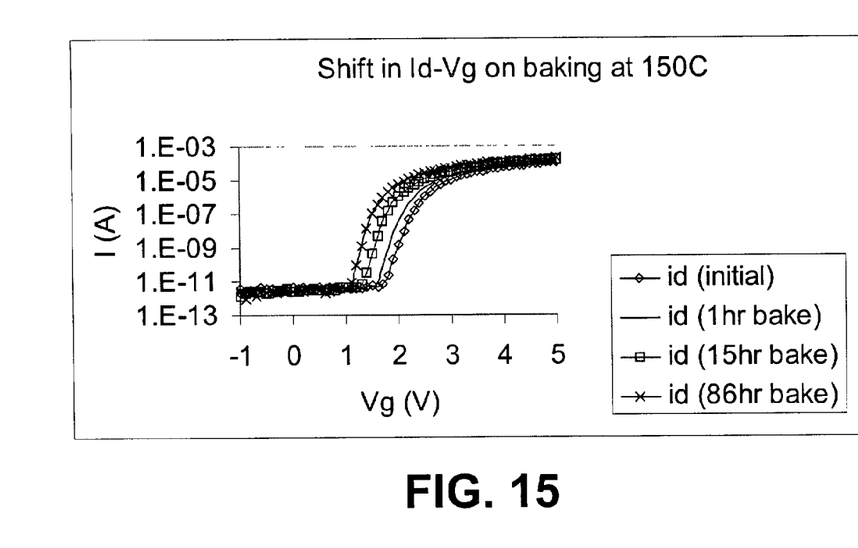
FIG. 15 illustrates a subthreshold slope of an exemplary semiconductor device consistent with the present invention during a baking process.

Data retention for memory devices consistent with the present invention have also been tested under elevated temperature (150° C.). FIG. 15 illustrates data retention for a QWMD device with 5 nm GOX and 2.7 nm BOX, that was programmed using tunneling at $V_{gs}$=7V. As illustrated in FIG. 15, the subthreshold slope does not degrade during the 150° C. bake.

Figure 16:
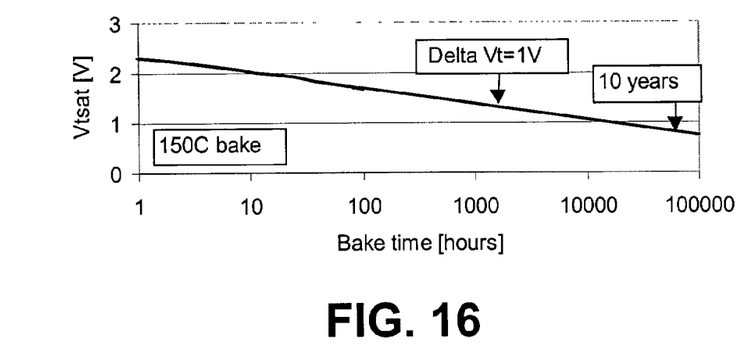
FIG. 16 illustrates a data retention curve for an exemplary semiconductor device consistent with the present invention.

FIG. 16 illustrates a data retention curve for a QWMD device with a targeted $\Delta V_t$ of 1V (i.e., threshold voltage shift of 1 volt to enable multibit memory applications). Referring to FIG. 16, the data retention curve shows that at high operation temperature (150° C.), the threshold voltage shift occurs after 1700 hours. Even after ten years, the extrapolated threshold voltage shift is only about 1.6V, which is well within commercially practical ranges.

In summary, the non-volatile memory device described above can be scaled well below a 5 nm gate length, while achieving excellent charge retention at room temperature. The device formation includes two processes that may be self-limiting: the gate oxide 12 undercut (illustrated and described with respect to FIG. 2) and the oxidation of the polysilicon 40 (illustrated and described with respect to FIG. 5). These self-limiting processes enable better manufacturability sensitivity. In addition, very fast operation can be achieved by using thin oxide layers to create small cavities 38, resulting in a very thin polysilicon inserts 52. The ten-year data retention times for such devices can be achieved even for very thin oxides (e.g., 2.7 nm). Further optimizations may also be achieved with drain junction engineering.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to necessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) processes can be employed.

In practicing the present invention, conventional photolithographic and etching techniques are employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A memory device, comprising:
   a semiconductor substrate comprising a channel region, a source region and a drain region;
   a gate electrode having an upper surface and side surfaces;
   a dielectric layer formed on an upper surface of the semiconductor substrate, the dielectric layer extending laterally below the gate electrode; and silicon structures formed within a portion of the dielectric layer and located between the semiconductor substrate and each of the side surfaces of the gate electrode, the silicon structures extending laterally below a portion of the gate electrode, wherein the silicon structures act as a floating gate electrode for the memory device and a thickness of the dielectric layer located between the semiconductor substrate and the silicon structures is less than a thickness of the dielectric layer located between the silicon structures and the gate electrode.

2. The memory device of claim 1, wherein the silicon structures comprise first and second structures, the first structure extending laterally below a first one of the side surfaces of the gate electrode and the second structure extending laterally below a second one of the side surfaces of the gate electrode.

3. The memory device of claim 2, wherein each of the first and second structures comprise a continuous polysilicon structure below each of the respective side surfaces of the gate electrode.

4. The memory device of claim 1, wherein the silicon structures comprise a plurality of discontinuous pockets of polysilicon, the plurality of discontinuous pockets of polysilicon together storing a charge that may be read.

5. The memory device of claim 1, wherein a portion of the dielectric layer located between the semiconductor substrate and the gate electrode comprises a tunnel oxide.

6. The memory device of claim 1, wherein the dielectric layer extends over the upper and side surfaces of the gate electrode, the memory device further comprising:
nitride sidewall spacers formed adjacent a portion of the dielectric layer that extends over the side surfaces of the gate electrode.

7. A memory device, comprising:
a semiconductor substrate comprising a channel region, a source region and a drain region;
a gate electrode;
a dielectric layer formed on an upper surface of the semiconductor substrate, the dielectric layer extending laterally below the gate electrode; and
silicon structures formed within the dielectric layer, the silicon structures extending laterally below a portion of the gate electrode, wherein the silicon structures act as a floating gate electrode for the memory device and have a cross-sectional size of about 50 Å in length and 20 Å in heights, wherein a thickness of the dielectric layer located between the semiconductor substrate and the silicon structures is less than a thickness of the dielectric layer located between the silicon structures and the gate electrode.

8. A memory device, comprising:
a semiconductor substrate comprising a channel region, a source region and a drain region;
a gate electrode having an upper surface and side surfaces;
a dielectric layer formed on an upper surface of the semiconductor substrate, the dielectric layer extending laterally below the gate electrode; and
silicon structures formed within a portion of the dielectric layer and located between the semiconductor substrate and the side surfaces of the gate electrode, the silicon structures extending laterally below a portion of the gate electrode, wherein the silicon structures act as a floating gate electrode for the memory device and have a teardrop-like shape.

9. A non-volatile memory device, comprising:
a semiconductor substrate comprising a channel region, a source region and a drain region;
a gate electrode having an upper surface and side surfaces;
a tunnel oxide layer formed on an upper surface of the semiconductor substrate below the gate electrode; and
a quantum well formed in the tunnel oxide layer, wherein the quantum well acts as a floating gate electrode for the non-volatile memory device and a thickness of the tunnel oxide layer located between the substrate and the quantum well is less than a thickness of the tunnel oxide layer located between the quantum well and the gate electrode.

10. The non-volatile memory device of claim 9, wherein the quantum well comprises a number of polysilicon structures formed in at least one of a continuous or discontinuous manner below the side surfaces of the gate electrode.

11. The non-volatile memory device of claim 9, wherein the channel region comprises silicon doped with p-type impurities and the source and drain regions comprise silicon doped with n-type impurities.

12. The non-volatile memory device of claim 9, further comprising:
an oxide layer formed over the upper and side surfaces of the gate electrode; and
nitride sidewall spacers formed adjacent a portion of the oxide layer that extends over the side surfaces of the gate electrode.

13. The non-volatile memory device of claim 10, wherein the number of polysilicon structures are formed in a discontinuous manner and together store a charge that may be read.

14. The non-volatile memory device of claim 9, wherein the quantum well has a teardrop-like cross-sectional shape.

15. The non-volatile memory device of claim 9, wherein the quantum well has a cross-sectional area of about 1000 square angstroms.

16. A non-volatile memory device, comprising:
a semiconductor substrate comprising a channel region, a source region and a drain region;
a gate electrode having an upper surface and side surfaces;
a tunnel oxide layer formed on an upper surface of the semiconductor substrate below the gate electrode; and
a quantum well having a teardrop-like cross-sectional shape formed in the tunnel oxide layer, wherein the quantum well acts as a floating gate electrode for the non-volatile memory device.

17. A semiconductor device, comprising:
a channel region;
a source region;
a drain region;
a control gate;
a dielectric layer formed on an upper surface of the semiconductor substrate, the dielectric layer extending laterally below the control gate; and
at least one silicon structure formed within the dielectric layer, the at least one silicon structure acting as a charge storage element for the semiconductor device and wherein a first portion of the at least one silicon structure extends directly below the control gate and a second portion of the at least one silicon structure does not extend directly below the control gate.

18. The semiconductor device of claim 17, wherein the at least one silicon structure has a teardrop-like cross-sectional shape.

19. The semiconductor device of claim 17, wherein a thickness of the dielectric layer located between the semiconductor substrate and the at least one silicon structure is less than a thickness of the dielectric layer located between the at least one silicon structure and the control gate.

20. The semiconductor device of claim 17, wherein the at least one silicon structure comprises more than two silicon structures that together store a charge that can be read.

* * * * *